United States Patent
Hwang et al.

(10) Patent No.: US 7,829,367 B2
(45) Date of Patent: Nov. 9, 2010

(54) IMAGE SENSOR AND METHOD FOR MANUFACTURING THE SAME

(75) Inventors: Sang Il Hwang, Wonju-si (KR); Jeong Yel Jang, Suwon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/654,489

(22) Filed: Dec. 22, 2009

(65) Prior Publication Data

US 2010/0173442 A1    Jul. 8, 2010

Related U.S. Application Data

(62) Division of application No. 11/878,384, filed on Jul. 24, 2007, now abandoned.

(30) Foreign Application Priority Data

Jul. 24, 2006    (KR) .................. 10-2006-0068977

(51) Int. Cl.
*H01L 21/00*    (2006.01)
*H01L 31/00*    (2006.01)

(52) U.S. Cl. .............. 438/57; 438/73; 257/E27.132

(58) Field of Classification Search .......... 438/80, 438/60, 57, 73; 257/E27.132, E31.084
See application file for complete search history.

(56) References Cited

U.S. PATENT DOCUMENTS

| 6,166,405 A * | 12/2000 | Kuriyama et al. ........... 257/290 |
| 6,376,868 B1 * | 4/2002 | Rhodes ........................ 257/215 |
| 6,504,195 B2 * | 1/2003 | Guidash ....................... 257/292 |
| 2006/0121640 A1 * | 6/2006 | Kim ............................. 438/57 |

\* cited by examiner

*Primary Examiner*—Victor A Mandala
*Assistant Examiner*—Scott Stowe
(74) *Attorney, Agent, or Firm*—Finnegan, Henderson, Farabow, Garrett & Dunner, L.L.P.

(57) ABSTRACT

An image sensor and a method for manufacturing the same are provided. In the method, a photoresist is formed on a substrate including a photodiode region and a gate electrode opposite to the photodiode region on the basis of the gate electrode. An oxide layer is formed to a specific thickness on both the photodiode region and a part of the gate electrode. The photoresist is removed from the substrate and cleaned. A first oxide film is formed on the substrate, the gate electrode, and the oxide layer remaining on the photodiode region. A nitride film is formed on the first oxide film. And a second oxide film is formed on the nitride film. Blank etching is performed on the first oxide film, the nitride film, and the second oxide film to form a spacer at the side of the gate electrode.

7 Claims, 4 Drawing Sheets

IMAGE SENSOR AND METHOD FOR MANUFACTURING THE SAME

RELATED APPLICATION

This application is a divisional of application Ser. No. 11/878,384, filed Jul. 24, 2007, now abandoned and is based upon and claims the benefit of priority from Korean Patent Application No. 10-2006-68977 filed on July 24, 2006, the entire contents of all of which are incorporated herein by reference.

BACKGROUND

1. Technical Field

The present invention relates to a method for manufacturing an image sensor, and more particularly, to an image sensor having a gate spacer, which can prevent damage to a photodiode region in the image sensor.

2. Discussion of the Related Art

An image sensor is a semiconductor device that can convert an optical image into an electrical signal. A Charge Coupled Device (CCD) is a device in which individual Metal-Oxide-Silicon (MOS) capacitors are located very close to each other to store and carry charge carriers. A CMOS image sensor is a device that has the same number of MOS transistors as the number of pixels and employs a switching method in which outputs are detected sequentially using the MOS transistors. Here, the MOS transistors are formed with CMOS technology in which a control circuit and a signal processing circuit are used as peripheral circuits.

Such an image sensor has a Color Filter Array (CFA) arranged on an optical detection portion that receives external light and generates and stores photo-generated charges. The color filter array includes red, green, and blue color filters or yellow, magenta, and cyan color filters. The image sensor is composed of an optical detection portion which detects light and a logic circuit portion which processes the detected light into an electrical signal and creates corresponding data. Although efforts have been made to increase a fill factor, which is the ratio of the area of the optical detection portion to the entire area of the image sensor, in order to increase optical sensitivity, there are limitations in the efforts with the restricted area since it is not possible to essentially remove the logic circuit portion.

A focusing technology has been introduced to change the path of light incident on areas other than the optical detection portion and thus to focus the incident light on the optical detection portion. A method of forming microlenses on the color filters in the image sensor is used to accomplish this focusing.

FIG. 1A is an equivalent circuit diagram of a unit pixel (dashed in the drawing) of a conventional CMOS image sensor.

As shown in FIG. 1A, the unit pixel includes one photodiode PD and four NMOSs Tx, Rx, Sx, and Dx (specifically, a transfer transistor TX, a reset transistor Rx, a select transistor Sx, and a drive transistor Dx). The transfer transistor Tx transfers photo-generated charges collected at the photodiode PD to a floating diffusion (FD) region. The reset transistor Rx sets voltage at the node to a desired level and discharges charges Cpd to reset the floating diffusion region. The drive transistor Dx serves as a source follower buffer amplifier. The select transistor Sx is switched to allow addressing.

Each of the transfer and reset transistors Tx and Rx use a native NMOS transistor. Each of the drive and select transistors Dx and Sx uses a normal NMOS transistor. Reset transistor Rx is a transistor for Correlated Double Sampling (CDS).

In the unit pixel of the CMOS image sensor as shown in FIG. 1A, light in the visible wavelength range is detected at the photodiode region (PD) using the native transistor and the detected photo-generated charge is transferred to the floating diffusion region (FD) and an electrical signal corresponding to the amount of the photo-generated charge provided to the gate of the drive transistor Dx is output through an output terminal of the unit pixel.

FIG. 1B is a sectional view of a conventional CMOS image sensor device. This figure shows only a portion of the device corresponding to both the photodiode PD and the transfer transistor Tx which transfers photo-generated charges collected at the photodiode PD to the floating diffusion region PD. The following is a brief description of a method for manufacturing an image sensor with reference to FIG. 1B. A p-type epitaxial layer 12 doped with a low-concentration p-type impurity is grown on a p+ substrate 11 doped with a high-concentration p-type impurity and a field oxide layer 13. Separation between unit pixels is formed on a specific portion of the p-type epitaxial layer 12 using a local oxidation of silicon (LOCOS) method.

A gate electrode 14 of a transfer transistor Tx is formed on the p-type epitaxial layer 12. Although not shown, gate electrodes of a drive transistor Dx, a reset transistor Rx, and a select transistor Sx are formed simultaneously at this time.

An n-type diffusion layer 15 is formed in a portion of the p-type epitaxial layer 12 at one side of the gate electrode 14 of transfer transistor Tx by implanting low-concentration n-type impurity ions with high energy into the epitaxial layer 12. An insulation layer for spacers is then deposited over the entire area of the substrate and blank etching is performed on the insulation layer to form a spacer 16 in contact with either sidewall of the gate electrode 14 of the transfer transistor Tx.

Subsequently, low-energy p-type impurity ions are implanted, for example, using a blanket ion implantation method, to form a p-type diffusion layer 17 in a top portion of the n-type diffusion layer 15 and a surface portion of the p-type epitaxial layer 12. Here, the p-type diffusion layer 17 formed in the n-type diffusion layer 15 is separated from gate electrode 14 as far as the thickness of the spacer 16.

A shallow pn junction including the p-type diffusion layer 17 and the n-type diffusion layer 15 is formed through such implantation of low-energy p-type impurity ions. As a result, a pnp type photodiode including the p-type epitaxial layer 12, the n-type diffusion layer 15, and the p-type diffusion layer 17 is formed.

In the conventional image sensor including the pnp type photodiode region, blank etching is performed on the insulation layer to form the spacer 16 in contact with either sidewall of the gate electrode 14 of the transfer transistor Tx as described above. In this case, the photodiode region A may be excessively corroded as shown in FIG. 1C to open the photodiode, thereby causing damage to the image sensor and thus degrading the performance of the image sensor.

BRIEF SUMMARY

Accordingly, the present invention is directed to an image sensor and a method for manufacturing the same.

Additional features will be set forth in part in the description which follows and in part will become apparent to those having ordinary skill in the art upon examination of the following or may be learned from practice of the invention. The features may be realized and attained by the structure particularly pointed out in the written description and claims hereof as well as the appended drawings.

There is provided a method for manufacturing an image sensor includes forming a photoresist on a substrate including a photodiode region and a gate electrode opposite to the photodiode region on the basis of the gate electrode; forming an oxide layer to a specific thickness on both the photodiode region and a part of the gate electrode; removing the photoresist from the substrate and cleaning the substrate; forming a first oxide film on the substrate, the gate electrode, and the oxide layer remaining on the photodiode region; forming a nitride film on the first oxide film; forming a second oxide film on the nitride film; and performing blank etching on the first oxide film, the nitride film, and the second oxide film to form a spacer at the side of the gate electrode.

In another aspect, an image sensor includes a substrate including a photodiode region formed therein; a gate electrode formed on the substrate, the gate electrode being in contact with the photodiode region; an oxide layer with a specific thickness formed on the photodiode region; and a spacer provided at one side of the gate electrode opposite to the oxide layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute "a part of this application, illustrate embodiment(s) consistent with the invention and together with the description serve to explain the invention.

In the drawings.

DETAILED DESCRIPTION

Reference will now be made in detail to embodiments consistent with the present invention, examples of which are illustrated in the accompanying drawings. Wherever possible, the same reference numbers will be used throughout the drawings to refer to the same or like parts.

Figure 1A:
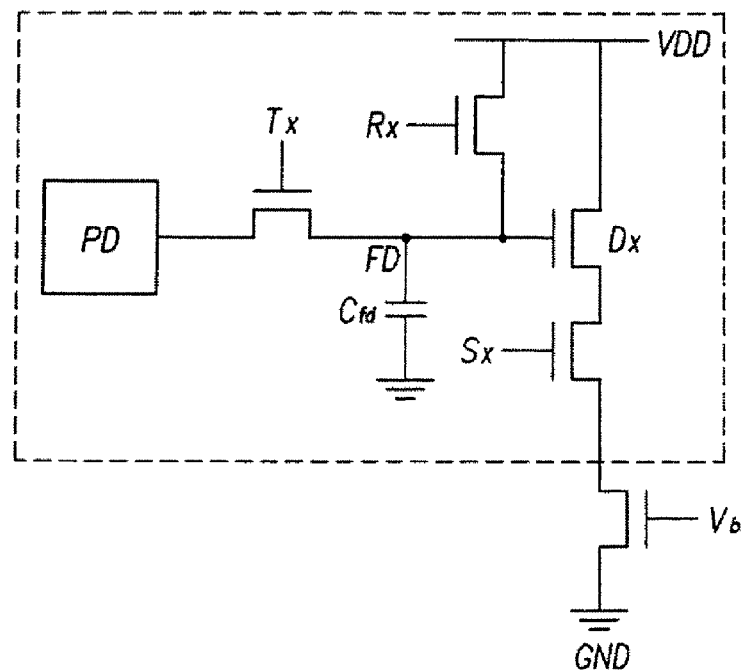
FIG. 1A is an equivalent circuit diagram of a conventional CMOS image sensor.
Figure 1B:
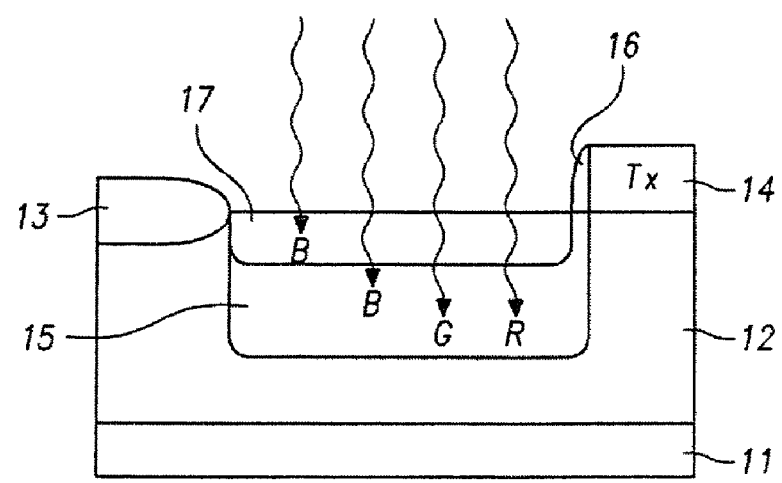
FIG. 1B is a sectional view of a conventional CMOS image sensor.
Figure 1C:
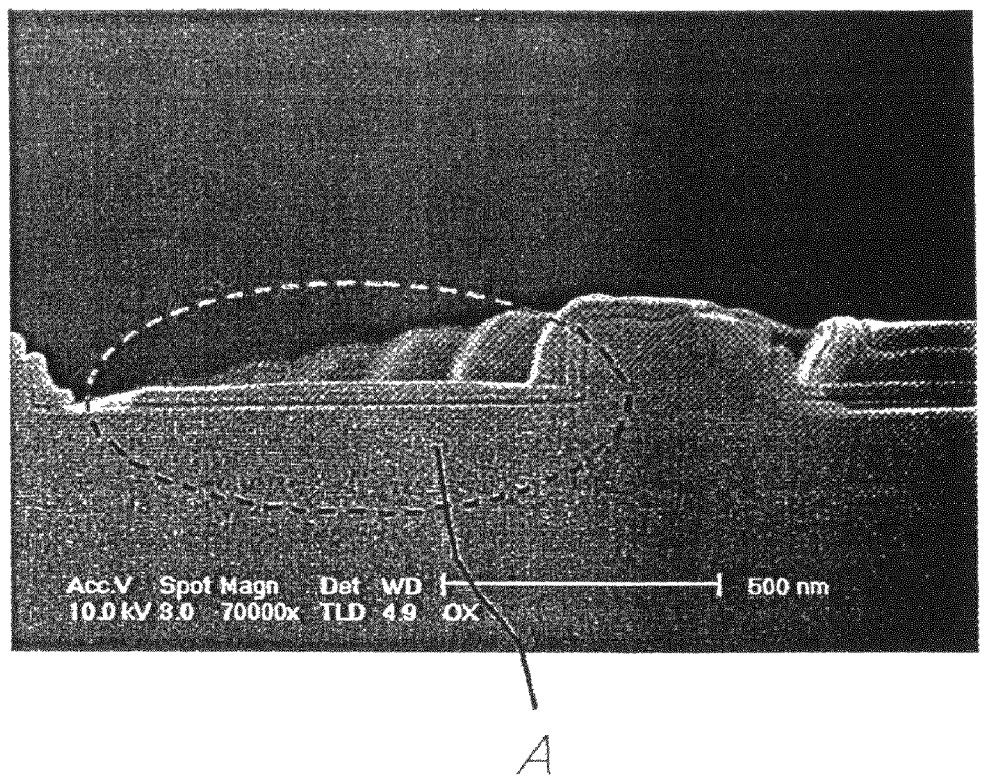
FIG. 1C illustrates damage to a photodiode region that may occur in the conventional CMOS image sensor.
Figure 2A:
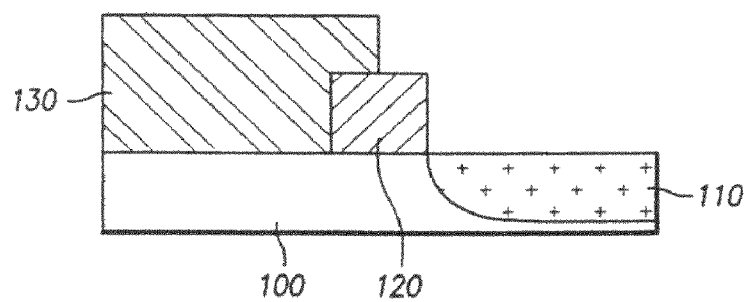
FIGS. 2A to 2E are sectional views of a procedure for manufacturing an image sensor according to an embodiment of the present invention.

FIGS. 2A to 2E are sectional views illustrating a procedure for manufacturing an image sensor according to an embodiment consistent with the present invention. The sectional view of FIG. 2A illustrates a photoresist 130 that is coated to a specific thickness on a substrate 100 on one side of a gate electrode 120 formed outside a photodiode region 110 on the substrate 100. The substrate 100 may be one selected from a silicon substrate, a Silicon On Insulator (501) substrate, a GaAs substrate, a SiGe substrate, and a ceramic substrate.

Figure 2B:
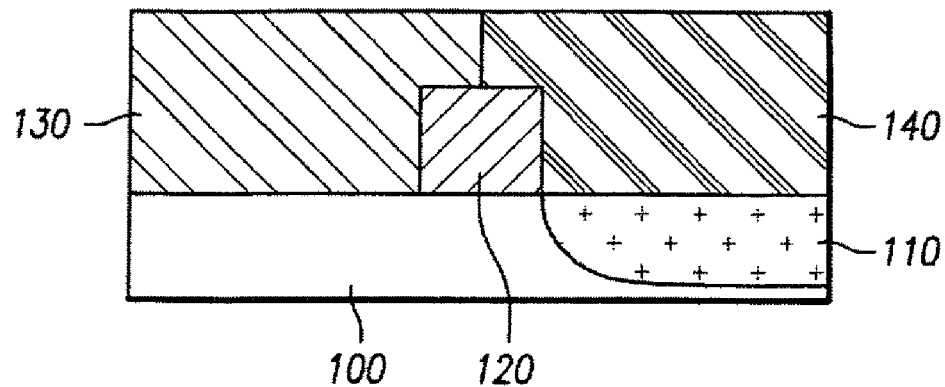

The photoresist 130 is coated to a specific thickness on the substrate 100 in an area of the substrate other than the photodiode region 110 as shown in FIG. 2A. Oxide layer 140 is then formed to a thickness of 3000-3500 Å on both the photodiode region 110 and a part of the gate electrode 120 as shown in FIG. 2B.

The oxide layer 140 is formed to a thickness of 3000-3500 Å, for example, by depositing a $SiO_2$ layer in a low temperature atmosphere with silane gas in a Chemical Vapor Deposition (CVD) chamber and then performing a Chemical Mechanical Polishing (CMP) process on the $SiO_2$ layer. In detail, as shown in FIGS. 2A and 2B, the photodiode region 110 is formed on the surface part of the substrate 100. The gate electrode 120 is formed on the substrate 100 including the photodiode region 110. The gate electrode 120 is formed adjacent to the photodiode region 110. Then, the photoresist 130 and the oxide layer 140 are formed sequentially on the substrate so that the gate electrode 120 can be covered. First, the photoresist 130 is formed on the substrate 100 as well as on one part of the gate electrode 120. Second, the oxide layer 140 is formed on the substrate 100 where the photodiode is formed as well as on another part of the gate electrode 120. Accordingly, a contact surface between the photoresist 130 and the oxide layer 140 is formed in the center of the upper surface of the gate electrode 120.

Figure 2C:
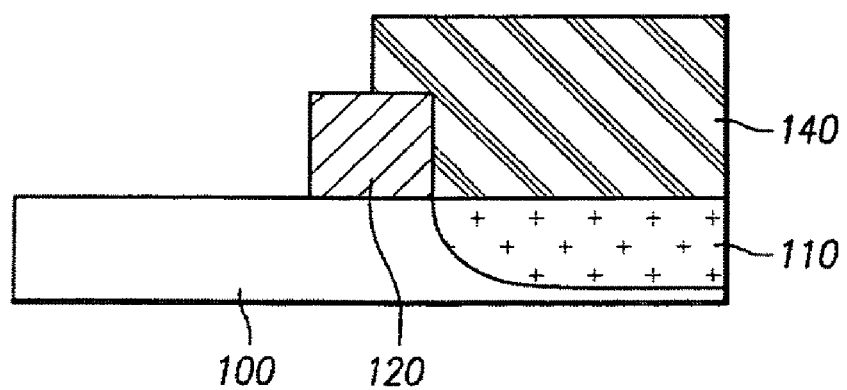

After the oxide layer 140 is formed in this manner, ashing and cleaning processes are performed on the photoresist 130 to remove the photoresist 130 so that only the oxide layer 140 remains on both the gate electrode 120 and the substrate 100 as shown in FIG. 2C.

Figure 2D:
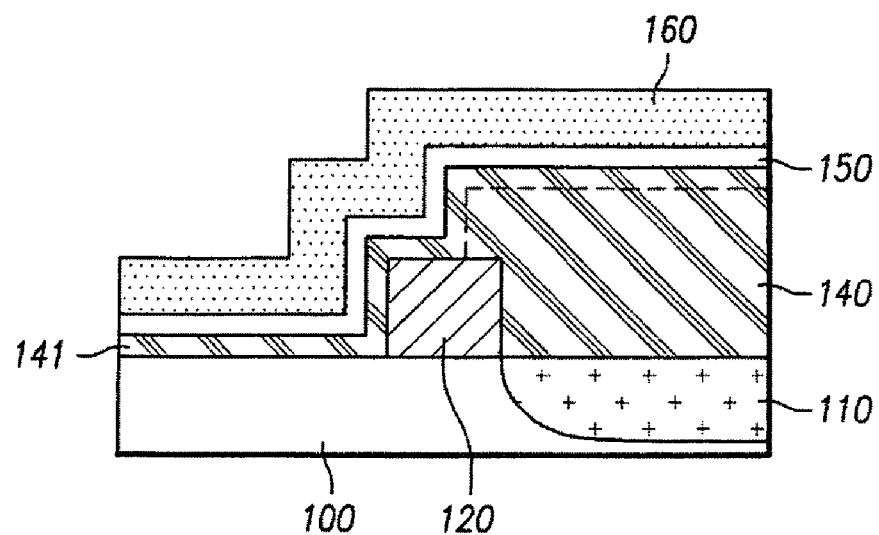

Then, a multilayer structure including a first oxide film 141 of the same material as the oxide layer 140, a nitride film 150, and a second oxide film 160 is formed on the substrate 100, the gate electrode 120, and the oxide layer 140 as shown in FIG. 2D.

First, the first oxide film 141 is formed by depositing a $SiO_2$ film in a low temperature atmosphere with silane gas in a Chemical Vapor Deposition (CVD) chamber in the same manner as the process of forming the oxide layer 140. The $SiO_2$ film is then etched so that the first oxide film 141 is shaped with steps on the gate electrode 120 and the oxide layer 140. The first oxide film 141 is formed on the substrate 100 opposite to the photodiode region 110, the one part of the gate electrode 120 where the photoresist 130 is removed, and the oxide layer 140 remaining on the photodiode region 110.

The nitride film 150 is then formed on the first oxide film 141 formed in this manner. For example, the nitride film 150 may be a $SiN_x$ film that is formed to a uniform thickness through deposition using $SiH_4$, $NH_3$, and $H_2$ at a temperature of 350° C.

The second oxide film 160 is also formed on the nitride film 150, by depositing a $SiO_2$ film in a low temperature atmosphere with silane gas in a Chemical Vapor Deposition (CVD) chamber in the same manner as the process of forming the oxide layer 140. The first oxide film 141, the nitride film 150 and the second oxide film 160 are shaped with steps on the gate electrode 120 and in the side of the gate electrode 120.

Figure 2E:
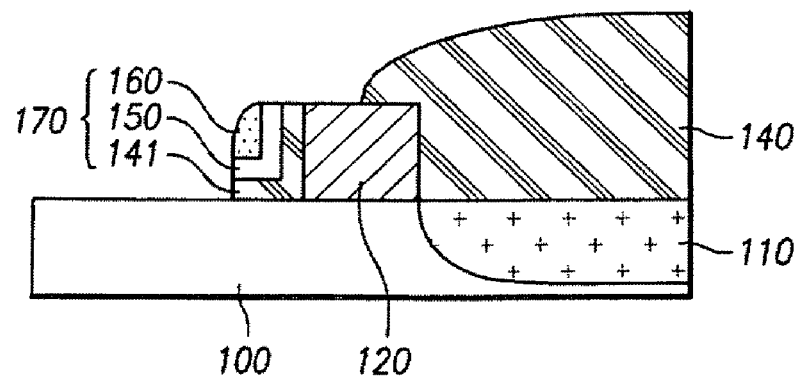

After the multilayer structure including the first oxide film 141, the nitride film 150, and the second oxide film 160 is formed on the substrate 100, the gate electrode 120, and the oxide layer 140; blank etching is performed on the multilayer structure using a Reactive Ion Etching (RIE) method to form a spacer 170 on the substrate 100 on the left side surface of the gate electrode 120 as shown in FIG. 2E.

The oxide layer 140 with a specific thickness remains on the photodiode region 110 by performing blank etching for forming the spacer 170 with exposing the gate electrode 120. A Pre-Metal Dielectric (PMD) layer (not shown) is formed on both spacer and the oxide layer 140 remaining on the photodiode region 110 by depositing and annealing one material selected from borosilicate glass (BSG), phosphosilicate glass (PSG), borophosphosilicate glass (BPSG), and undoped silicate glass (USG) and then flattening the surface of the PMD layer through a CMP process. The PMD layer may be formed of the same material as the remaining oxide layer 140.

Since oxide layer 140 is etched into a specific shape and remains on the photodiode region 110 when the spacer 170 is formed on the substrate 100, it is possible to prevent the photodiode region from being corroded and thus being exposed, which may occur in the conventional procedure for forming the spacer for the gate electrode, thereby improving the performance of the image sensor.

As is apparent from the above description, there is provided an image sensor and a method for manufacturing the same which can prevent a photodiode region from being corroded that may occur through etching in a conventional procedure for forming a gate electrode spacer, thereby solving the problem of exposure of the photodiode region and thus improving the performance of the image sensor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an image sensor, the method comprising:
    forming a gate electrode on a substrate including a photodiode region, wherein the gate electrode is formed adjacent to the photodiode region;
    forming a photoresist on the substrate, wherein the photoresist covers one part of the gate electrode;
    forming an oxide layer on the substrate where the photodiode is formed, wherein the oxide layer covers the photodiode region and another part of the gate electrode;
    removing the photoresist from the substrate and cleaning the substrate;
    forming a first oxide film on the substrate opposite to the photodiode region, the one part of the gate electrode where the photoresist is removed, and the oxide layer remaining on the photodiode region;
    forming a nitride film on the first oxide film;
    forming a second oxide film on the nitride film; and
    performing blank etching on the first oxide film, the nitride film, and the second oxide film to form a spacer at a sidewall of the one part of the gate electrode.

2. The method according to claim 1, further comprising forming a Pre-Metal Dielectric (PMD) layer on both the oxide layer remaining on the photodiode region and the spacer formed at the side of the gate electrode.

3. The method according to claim 2, wherein the PMD layer is formed by depositing and annealing a material selected from borosilicate glass (BSG), phosphosilicate glass (PSG), borophosphosilicate glass (BPSG), and undoped silicate glass (USG) and then flattening a surface of the PMD layer through a Chemical Mechanical Polishing (CMP) process.

4. The method according to claim 1, wherein the oxide layer includes a $SiO_2$ layer that is formed having a thickness of 3000-3500 Å by depositing $SiO_2$ in a low temperature atmosphere with silane gas in a Chemical Vapor Deposition (CVD) chamber and then performing a CMP process.

5. The method according to claim 1, wherein the blank etching is performed using a Reactive Ion Etching (RIE) method so that a portion of the oxide layer remains.

6. The method according to claim 2, wherein the PMD layer is formed using the same material as that of the oxide layer.

7. The method according to claim 1, wherein the spacer is formed with the first oxide film, the nitride film and the second oxide film being shaped with steps in the side of the gate electrode.

* * * * *